(12) United States Patent
Price et al.

(10) Patent No.: US 7,928,744 B2
(45) Date of Patent: Apr. 19, 2011

(54) MONITORING CIRCUIT HAVING A SELF TEST FUNCTION

(75) Inventors: Colin Price, Newbury (GB); Steven Boyle, Atkinson, NH (US); Asif Ahmad, Bangalore (IN)

(73) Assignee: Analog Devices, Inc., Norwood, MA (US)

( * ) Notice: Subject to any disclaimer, the term of this patent is extended or adjusted under 35 U.S.C. 154(b) by 223 days.

(21) Appl. No.: 12/326,552

(22) Filed: Dec. 2, 2008

(65) Prior Publication Data

US 2010/0134132 A1    Jun. 3, 2010

(51) Int. Cl.
    G05F 1/00    (2006.01)
(52) U.S. Cl. .................. 324/750.01; 320/134; 320/136; 323/288; 323/326
(58) Field of Classification Search .................. None
    See application file for complete search history.

(56) References Cited

U.S. PATENT DOCUMENTS

| | | | |
|---|---|---|---|
| 4,860,232 A | 8/1989 | Lee et al. | |
| 5,235,333 A | 8/1993 | Naylor et al. | |
| 5,631,537 A * | 5/1997 | Armstrong | 320/118 |
| 6,362,627 B1 * | 3/2002 | Shimamoto et al. | 324/434 |
| 6,639,408 B2 * | 10/2003 | Yudahira et al. | 324/434 |
| 7,362,588 B2 * | 4/2008 | Shimizu et al. | 361/785 |
| 7,592,774 B2 * | 9/2009 | Morimoto | 320/116 |
| 7,656,164 B2 * | 2/2010 | Kawamura | 324/434 |

FOREIGN PATENT DOCUMENTS

JP    06259173    9/1994

OTHER PUBLICATIONS

International Search Report dated Mar. 25, 2010, in counterpart international application No. PCT/US2009/066376.

* cited by examiner

*Primary Examiner* — Paresh Patel
(74) *Attorney, Agent, or Firm* — Kenyon & Kenyon LLP

(57) ABSTRACT

A measuring apparatus including a self test function, the circuit comprising a capacitor; first to fourth switches; a test signal injector; at least one comparator having a signal input and a reference input the first switch being interposed between a first plate of the capacitor and a first input node, the second switch being interposed between a second plate of the capacitor and a second input node, the third switch being interposed between the first plate of the capacitor and the signal input of the comparator and the fourth switch being interposed between the second plate of the capacitor and a voltage reference, wherein the self test function comprises the steps of i) operating the signal injector to produce a first signal representative of an out of range voltage for an expected voltage difference between the first and second input nodes, and using the signal to cause the at least one comparator to place its output in an error state, and to charge the capacitor to the out of range voltage, ii) isolating the capacitor from the signal injector and voltage reference, and connecting the capacitor between the first and second input nodes such that the voltage stored on the capacitor is overwritten by the voltage difference between the first and second nodes, and iii) and reconnecting the capacitor to the comparator and monitoring the comparator's output.

13 Claims, 4 Drawing Sheets

US 7,928,744 B2

MONITORING CIRCUIT HAVING A SELF TEST FUNCTION

FIELD OF THE INVENTION

The present invention relates to a voltage monitoring circuit having a self test function.

BACKGROUND OF THE INVENTION

It is frequently desirable to monitor the voltage across a device or a plurality of devices. Typically the voltage difference across the device may be monitored by a window comparator to check that the voltage difference is not too low or too high.

This approach may however allow latent faults to develop and go undeleted.

SUMMARY OF THE INVENTION

According to a first aspect of the present invention there is provided a monitoring apparatus including a self test function, the circuit comprising
a capacitor;
first to fourth switches;
a test signal injector;
at least one comparator having a signal input and a reference input and where the first switch is interposed between a first plate of the capacitor and a first input node, the second switch is interposed between a second plate of the capacitor and a second input node, the third switch is interposed between the first plate of the capacitor and the signal input of the comparator and the fourth switch is interposed between the second plate of the capacitor and a voltage reference,
wherein the self test function comprises the steps of
i) operating the signal injector to produce a first signal representative of an out of range voltage for an expected voltage difference between the first and second input nodes, and using the signal to cause the at least one comparator to place its output in an error state, and to charge the capacitor to the out of range voltage,
ii) isolating the capacitor from the signal injector and voltage reference, and connecting the capacitor between the first and second input nodes such that the voltage stored on the capacitor is overwritten by the voltage difference between the first and second nodes, and
iii) reconnecting the capacitor to the comparator and monitoring the comparator's output.

It is thus possible to provide a voltage monitoring circuit which can verify the operation of its comparator and the integrity of the connection to the device being monitored. The monitoring apparatus is suited for monitoring voltages across devices or units under test. However it will be appreciated that it could also be used to monitor current flow by briefly placing the capacitor in a current flow path and examining the rate at which it charges.

This apparatus is particularly beneficial when monitoring certain battery technologies which may be damaged by excess voltages.

Preferably voltage measuring apparatus constituting an embodiment of the invention has a plurality of input nodes to measure a plurality of input voltages.

Preferably first and second comparators are provided for each pair of input nodes so as to monitor for over voltage and under voltage conditions between the pair of input nodes.

The devices being monitored may be arranged in an array or stack. Thus for a series connected group of N batteries the voltage monitor can monitor the voltage across each individual battery using N+1 input nodes.

According to a second aspect of the present invention there is provided a method of testing a voltage measuring circuit, the circuit comprising a voltage comparator, a sampling element and a switching arrangement for selectively connecting the sampling element to the voltage comparator and to a unit under test, the method comprising the steps of:
a) operating the switching arrangement to enable the sampling circuit to attain a first voltage which causes the comparator to attain a first state,
b) operating the switching arrangement to enable the sampling circuit to sample the voltage across the unit under test, and
c) operating the switching arrangement to present the sampled voltage of the unit under test to the comparator, and monitoring the comparator output.

BRIEF DESCRIPTION OF THE DRAWINGS

The present invention will further be described, by way of example only, with reference to the accompanying figures, in which.

DESCRIPTION OF PREFERRED EMBODIMENTS OF THE INVENTION

Figure 1:
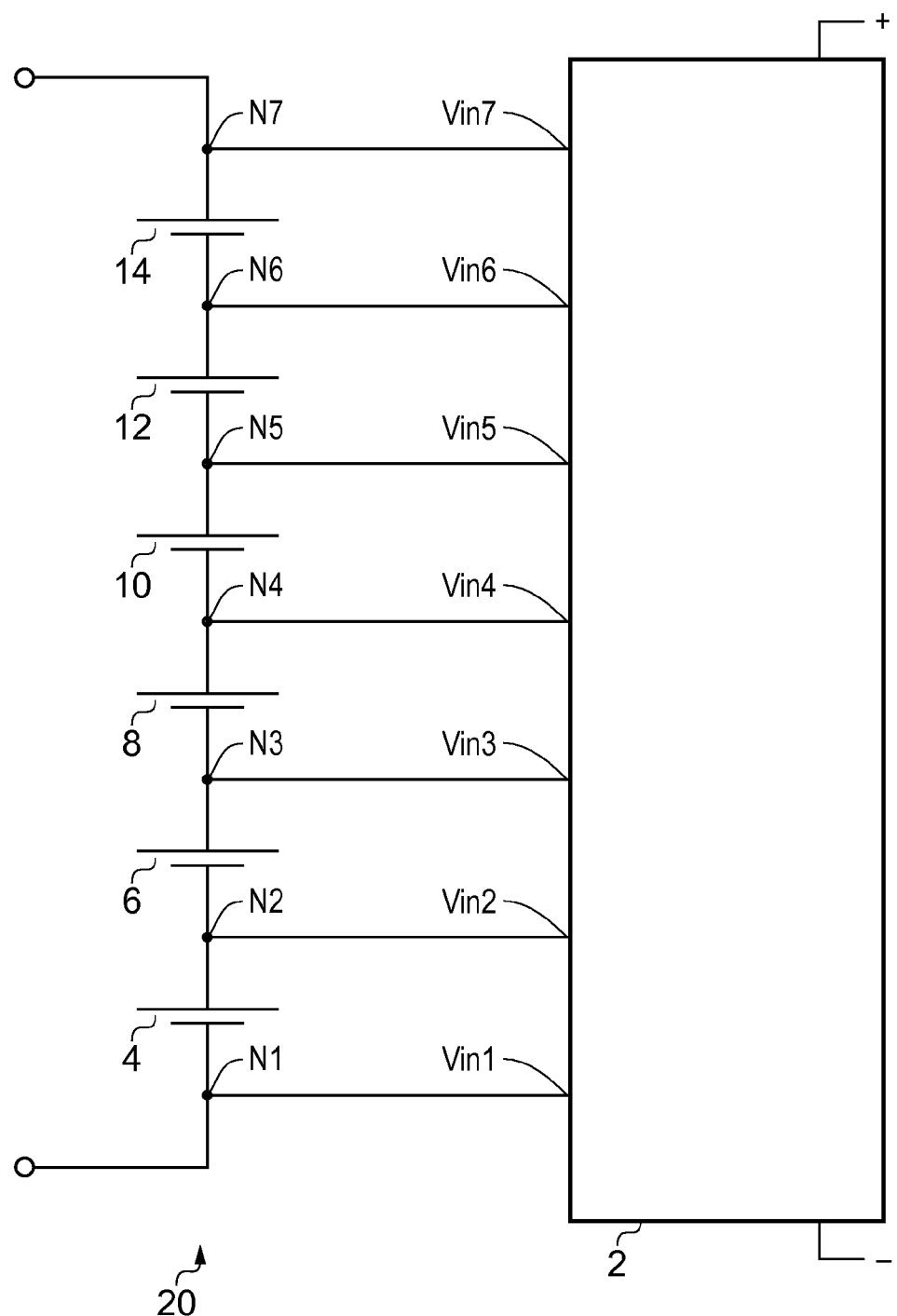
FIG. 1 schematically illustrates a battery monitoring circuit constituting an embodiment of the present invention in association with a group of six battery cells.

FIG. 1 schematically shows a battery monitor 2 arranged to monitor the voltage occurring across each individual cell 4, 6, 8, 10, 12 and 14 in a stack of cells, generally designated 20. Although six cells have been shown, the stack is not limited to such a number. Furthermore two or more stacks may themselves be arranged in series to produce higher voltages.

In order to measure a voltage across the first cell 4, the battery monitor 2 has a first input $V_{in}1$ connected to a first measurement node N1, which in this example is the negative terminal of the first cell 4, and a second input $V_{in}2$ connected to a second measurement node N2 which in this example is the positive terminal of the first cell. Cells 4 and 6 are connected in series so the voltage across the second cell 6 can be measured by comparing the voltage at the second measurement node N2 with the voltage at a third measurement node N3 connected to the positive terminal of the second cell 6 and the negative terminal of the third cell 8.

It can be seen that seven measurement nodes N1 to N7 allow the individual voltages across the 6 cells 4, 6, 8, 10, 12 and 14 to be monitored. The first to seventh measurement nodes are connected to the first to seventh inputs $V_{in}1$, $V_{in}2$, $V_{in}3$, $V_{in}4$, $V_{in}5$, $V_{in}6$ and $V_{in}7$, respectively.

Individual cells within the stack may charge at different rates, and each cell may have its own failure modes. It is, for example, known to provide switches in parallel and series with individual cells allow the cell to be switched out of the stack and a low impedance path put in place of the cell to prevent a cell from overcharging and/or to prevent a failure in a single cell causing the whole stack to become unusable. The switches for doing this are not shown as they are known to the person skilled in the art, and may be provided by a separate circuit not constituting part of the present invention.

It is desirable to have faith in the integrity of the measurement system. A good measurement system should not provide false negatives, i.e. showing the batteries to be within acceptable ranges when they are not. However, equally importantly it should not give false positives, i.e. showing a cell to be faulty when it is in fact operating within normal voltage ranges.

The voltage difference between each pair of inputs can be tested to check the cell voltage, for example the difference at the fourth input $V_{in}4$ and the fifth input $V_{in}5$ can be used to check the health of the fourth cell 10. But it would also be desirable to check the integrity of the comparator making that decision and the integrity of the connections to node N4 and N5 to be assured that they have not become high impedance.

Figure 2:
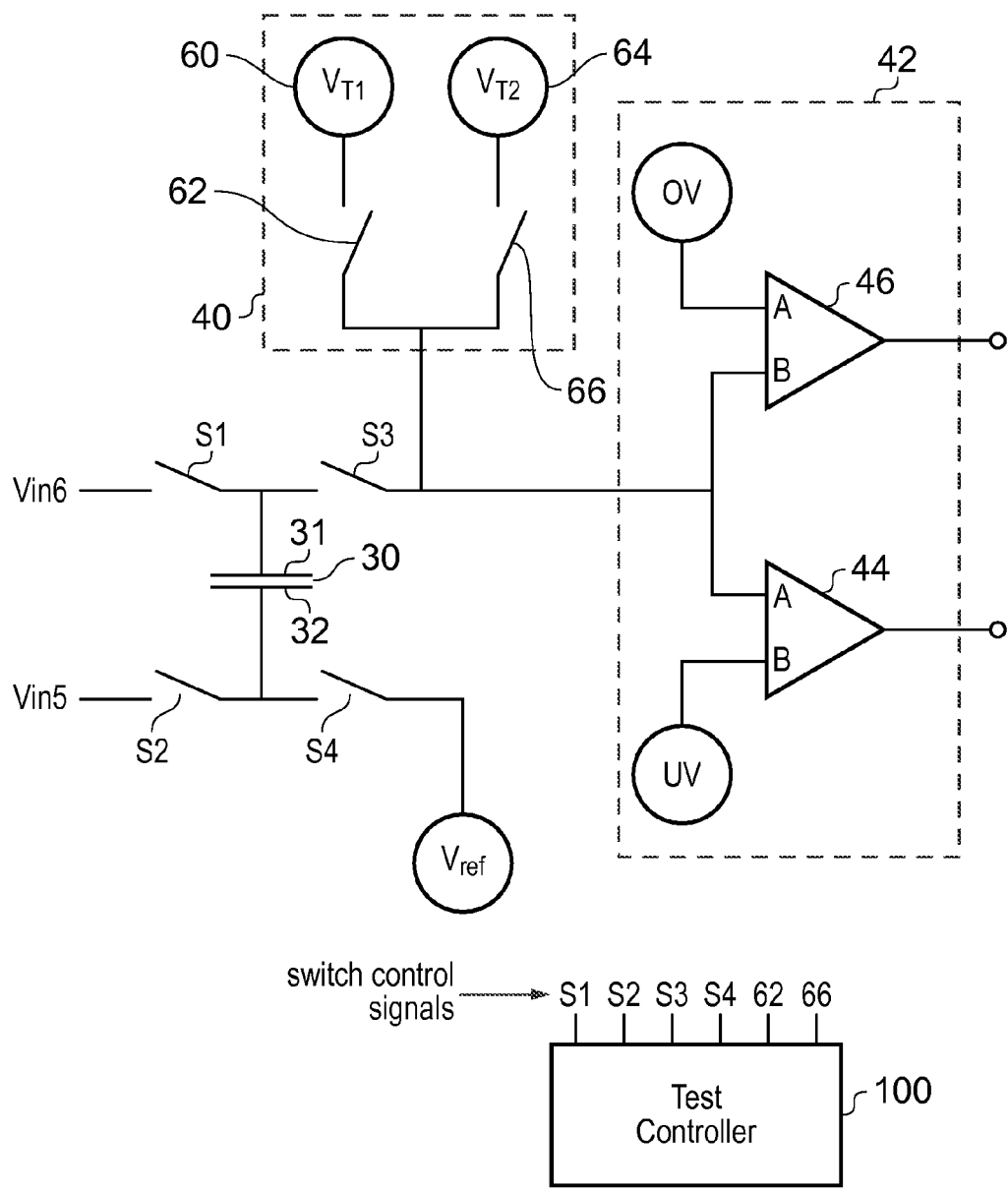
FIG. 2 schematically illustrates a monitoring circuit for monitoring the voltage across one of the battery cells.

FIG. 2 schematically illustrates a test circuit for testing the voltage between inputs $V_{in}5$ and $V_{in}6$. A similar arrangement is provided for each input pin $V_{in}1$-$V_{in2}$, $V_{in}2$-$V_{in}3$, $V_{in}3$-$V_{in}4$ and so on.

The circuit comprises a capacitor 30, for storing a voltage difference between the inputs $V_{in}5$ and $V_{in}6$, first to fourth electronically controlled switches S1 to S4, a test signal injector 40 and a comparator 42. In this example the comparator 42 is a window comparator comprising an under voltage comparator 44 and an over voltage comparator 46.

The first to fourth switches allow the input voltage difference to be captured across the capacitor 30 and voltage shifted to a more convenient voltage for presentation to the comparator.

Switch S1 is connected between a first plate 31 of the capacitor 30 and the sixth input $V_{in}6$. The switch S2 is connected between a second plate 32 of the capacitor 30 and the fifth input $V_{in}5$. The third switch is connected between the first plate 31 of the capacitor 30 and an input of the window comparator 42. The fourth switch is connected between the second plate of the capacitor 30 and a voltage reference 50, which could be specifically provided voltage source, but which conveniently is the local ground or a supply voltage to the monitoring circuit 2. For convenience the reference voltage 50 may be the voltage at the negative terminal of the battery stack 20.

In use switch S1 and switch S3 should not be closed (low impedance) at the same time, but they can both be open (high impedance) at the same time. Similarly switch S2 and S4 should not be closed at the same time, but they can both be open at the same time. A current limiting resistor may be provided in the potential path between $V_{in}5$ and the voltage reference 50 is desired so as to protect the circuit if a user or designer can inadvertently force S2 and S4 to close at the same time. Advantageously switch control logic is provided so as to ensure both switches cannot conduct at the same time, even at power-up or reset.

In use, S1 and S2 are closed so as to sample the battery voltage of cell 12 onto the capacitor 30. S1 and S2 are then opened so as to hold the battery voltage on the capacitor 30. Switch S4 is then closed to as to connect the second plate 32 of the capacitor to the voltage reference 50. This translates the voltage at the first plate of the capacitor to be equal to the sum of the reference voltage Vref provided by the voltage reference 50 (which for convenience is 0v) and the reference voltage across the cell 12. Switch S3 is then closed to connect plate 31 to the comparator 42. In practice S3 and S4 can be switched together.

At this point the comparator can be strobed to make a decision about the cell voltage sampled on the capacitor. This sampling process of connecting the capacitor to the cell, and then to comparator can be repeated as often as the designer requires. To aid this the comparator 46 receives an over voltage reference "OV" and the comparator 44 receives and under-voltage reference "UV".

The capacitor or the comparator input stage may hold a previously sampled charge for a long time, or leakage currents within the voltage monitoring device might cause the voltage on the capacitor to tend, over time, to a value which is indicative of either a good cell or a failed cell. This, in itself, is not a problem provided to switches S1 to S4 are functioning correctly and a low impedance connection can be made to the relevant nodes, N5 and N6, in this example.

However, the inventors realised that hitherto self test procedures had only checked the comparator and not the switches.

In order to overcome this problem a test signal injector 40 is provided.

The signal injector 40 can be as simple as a switched connection to a test voltage. However, as the circuit shown in FIG. 2 has a window comparator, then the signal injector needs to be able to inject two test voltages so as to check the over voltage comparator 46 and the under voltage comparator 44. In this example the signal injector comprises a first test voltage source 60 connectable to the signal input of the comparator via a first switch 62 and a second test voltage source 64 connectable to the signal input of the comparator 42 via a second switch 66.

The test voltages may be derived by simple resistive potential dividers connected between the supply rails of the battery monitor 2.

In use, for example at power up, or during a test sequence, the integrity of the window comparator and the switches S1 to S4 can be tested.

The comparator can be tested by applying one of the test voltages, for example the first test voltage $V_{TI}$ to simulate an over-range fault so as to cause the output of the comparator 46 to assume the fault signalling state.

This is done by opening switch S3 and closing switch 62, and if necessary strobing the comparator to make a decision.

Switch 62 can then be opened and switch 66 closed to as to apply an under voltage. The output of comparator 46 should assume the no fault condition and the output of comparator 44 should assume the fault signal condition. If this has happened then the operation of the comparator 42, and its sub-sections 44 and 46 has been tested and validated.

The switches can now be validated. This is done by sampling a test voltage onto the capacitor 30, then connecting the capacitor 30 to the cell such that the voltage is overwritten by the cell voltage and then the comparator checks the voltage on the capacitor. This should cause the comparator to change state if all is well. This could be done just the once, or can be repeated using both the first and second test voltages, and having each sequentially overwritten by the cell voltage.

Switches S1 and S2 are opened and after this has been achieved S3 and S4 are closed. The test voltage from the test voltage injector is now sampled on to the capacitor. In this example given the switch 62 is closed so that the over voltage test signal is sampled on to the capacitor, but the sequence of applying the test voltages can be reversed so that the under voltage is sampled on to the capacitor 30. The test voltage injector is then disconnected, so that both switches 62 and 66 are in a high impedance state.

Switches S3 and S4 are opened, and then switches S1 and S2 are closed. If the connections to the cell 12 are in good order then the voltage on the capacitor will be overwritten with the cell voltage.

Switches S1 and S2 are now opened (high impedance) and switches S3 and S4 are closed so as to reconnect the capacitor to the comparator and the comparator is strobed. The comparator had previously been showing a fault status (over voltage) but now if the switches and cell are good this fault status will be removed. The change in the output of the comparator thus confirms that the switches, the connection to the cell, and the cell are good, or as known to the person skilled in the art, the unit under test has passed "UUT Pass".

The above steps can then, if desired, be repeated using the other voltage reference. Thus switch 66 can be closed so as to charge the voltage on the capacitor to be representative of an under voltage. Switch 66 is then opened, along with switches S3 and S4. The comparator can optionally be strobed at this point so that it reports an under voltage error. Switches S1 and S2 are then closed and the cell voltage overwrites the VT2 as sampled onto the capacitor. Switches S1 and S2 are then opened so as to isolate the capacitor 30 and then switches S3 and S4 are closed so as to present the cell voltage to the comparator. The comparator can then be strobed and the output will change from an error state to an "cell ok" state if all is well.

Figure 3:
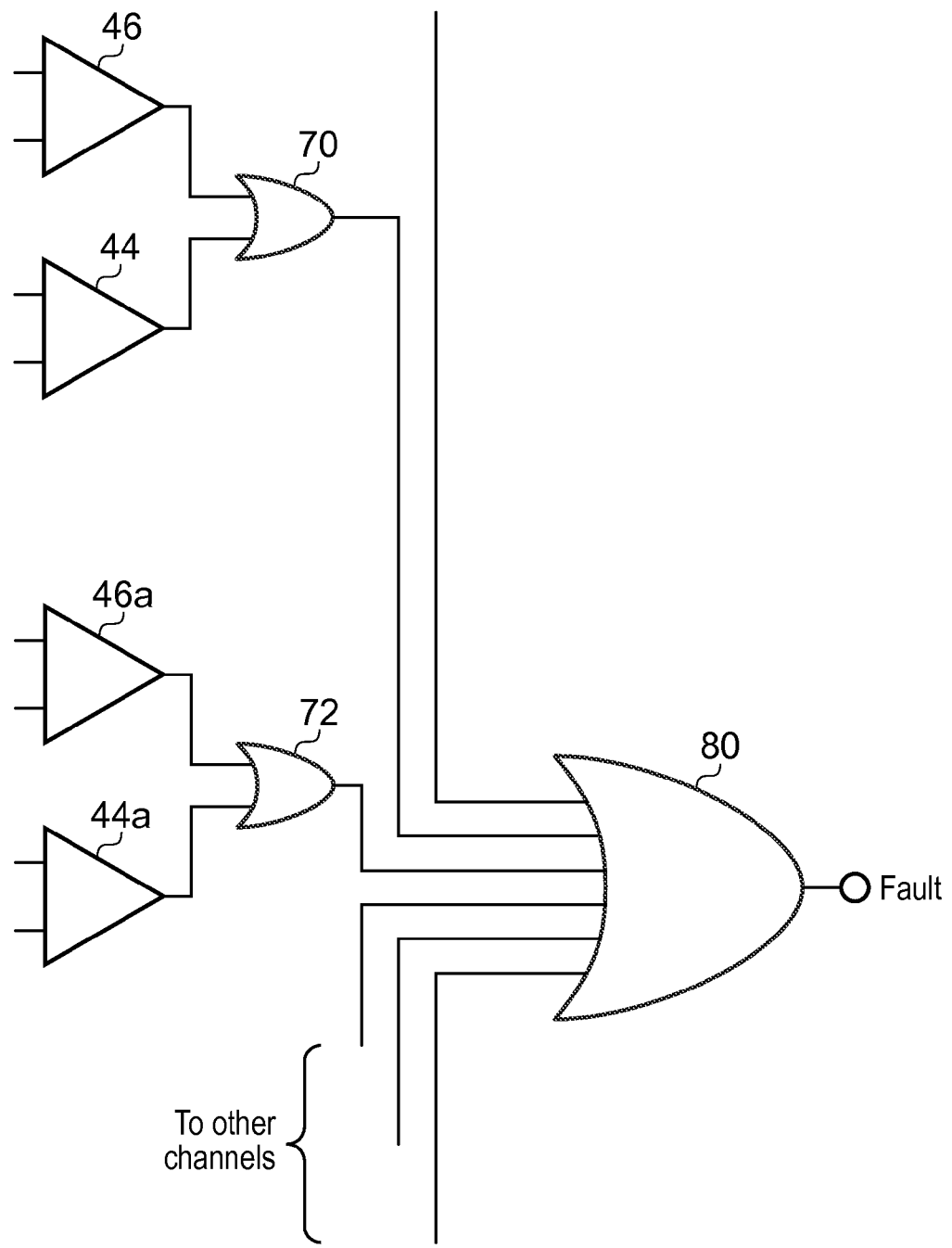
FIG. 3 schematically illustrates an arrangement for combining the results from the comparators to a single output.

The outputs of the individual comparators 44 and 46 may be directly monitored. However it may be more convenient to combine the outputs to a single output. For comparator 42 the outputs of under voltage and over voltage comparators 44 and 46 could simply be ORed together. Although this is simple it could result it being impossible to identify what fault condition has arisen—although this is probably sufficient as signalling of a fault could allow a more complex test routine to be initiated. Such an arrangement is shown in FIG. 3.

As multiple copies of the circuit in FIG. 2 exist—or at least multiple copies of switches S1 to S4 and capacitor 30—one per cell, the test signal injector 40 and the comparator 42 can be shared between multiple measurement channels in a time multiplexed manner. However, assuming that multiple copies of the test signal injector 40 and the comparator 42 exist, then, as shown in FIG. 3, the outputs of each comparator 46, 46a, 44, 44a and other similar comparators can be ORed together. This can be in a two stage structure as shown in FIG. 3 via OR gates 70, 72 and so giving a result for each channel, and then to OR gate 80 which gives a system level fault or pass output. In a single state structure OR gates 70, 72 would be omitted and the number of inputs to OR gate 80 would be doubled.

A test controller 100 (shown in FIG. 2) generates switch control signals for the switches S1 to S4, 62 and 66 in each channel.

The test controller 100 can be designed to test the channels in parallel or in sequence, depending on the internal configuration of the battery monitor 2. Thus, if each channel has its own test signal injector and comparator then the channels can be tested in parallel. However such a configuration can also have the channels tested in sequence if the designer so wishes.

It should be noted that a comparator 42, that is the over voltage source OV, the under voltage source UV, over voltage comparator 46 and under voltage comparator 44 can be shared in a time multiplexed manner between multiple channels by a multiplexer—or simply forming each switch S3 for each channel to a common comparator node.

Similarly the OR gates 44, 46 could be replaced with X-OR gates—one per comparator 44, 46, and an "correct result" signal applied to the other input of the X-OR gate such that a fault signal would only be asserted in a fault occurred during the test sequence.

The test controller can be implemented as a state machine to ensure the correct sequence of operation of the switches.

Figure 4:
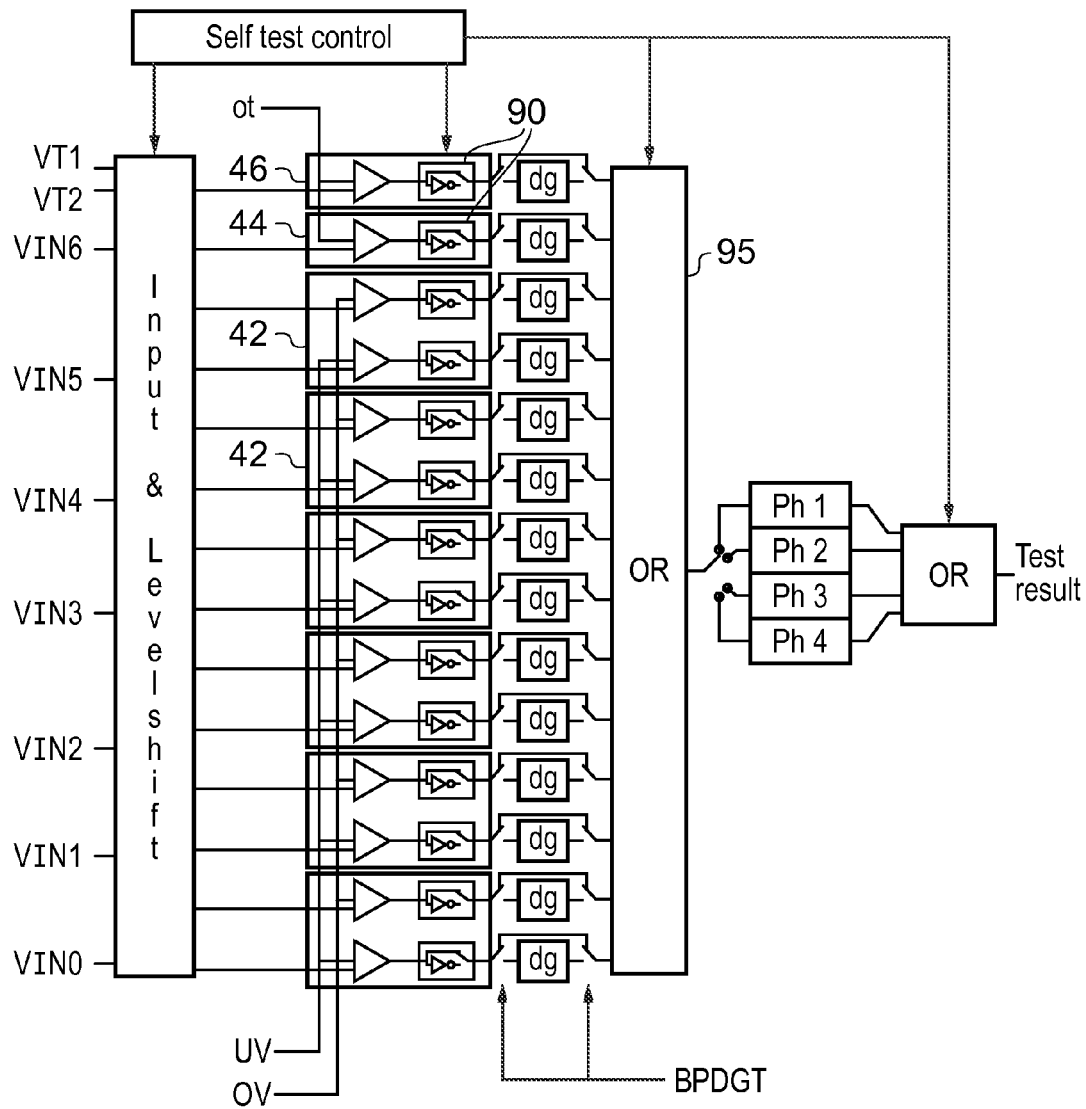
FIG. 4 schematically illustrates an alternative configuration for combining test results to a single test output.

FIG. 4 is schematically an alternative arrangement where each of the under voltage comparators and over voltage comparators can selectively have its output passed in an inverted form or non-inverted form by invertors 90. The outputs of the comparators can be latched by a deglitch block "dg" following each capacitor or directly provided to a large OR gate. The output of each phase of the test can be latched in latches Ph1 to Ph4, and the outputs of these latches combined to give an overall test pass or test fail for all of the cells associated with the voltage monitor.

The voltage monitors may themselves be arranged in a chain so a test output from one device in the chain may be received by a subsequent monitor, ORed with its own result and output. This output can then, if necessary be input to a further monitoring device.

The signals may only be propagated on the edges of the strobe signal to avoid passing transient results. Alternatively each block may only indicate a pass when it has completed its own tests and received a pass input from any units that are connected to propagate signals through it.

It is thus possible to provide an improved self test mechanism.

The battery tester described herein may be provided as a backup circuit to a digital volt meter circuit for obtaining accurate measurements of the charge across a cell.

The invention claimed is:

1. A measuring apparatus including a self test function, the circuit comprising:
   a capacitor;
   first to fourth switches;
   a test signal injector;
   at least one comparator having a signal input and a reference input, the first switch being interposed between a first plate of the capacitor and a first input node, the second switch being interposed between a second plate of the capacitor and a second input node, the third switch being interposed between the first plate of the capacitor and the signal input of the comparator, and the fourth switch being interposed between the second plate of the capacitor and a voltage reference, wherein the self test function comprises the steps of:
   i) operating the signal injector to produce a first signal representative of an out of range voltage for an expected voltage difference between the first and second input nodes, and using the signal to cause the at least one comparator to place its output in an error state, and to charge the capacitor to the out of range voltage,
   ii) isolating the capacitor from the signal injector and voltage reference, and connecting the capacitor between the first and second input nodes such that the voltage stored on the capacitor is overwritten by the voltage difference between the first and second nodes, and
   iii) reconnecting the capacitor to the comparator and monitoring the comparator's output.

2. A measuring apparatus as claimed in claim 1, in which the comparator comprises an over-voltage comparator, and the first signal simulates an over-voltage fault.

3. A measuring apparatus as claimed in claim 2, in which the comparator further comprises an under-voltage comparator, and the test signal injector is operable to provide a second signal to simulate an under-voltage fault.

4. A measuring apparatus as claimed in claim 1, in which an output of the comparator is compared with an expected state during the self test, and a fault is indicated if the comparator is not in the expected state.

5. A measuring apparatus as claimed in claim 1, comprising a plurality of measuring circuits each operable to measure a voltage across a respective unit under test, and combinational logic for combining the outputs of the measuring circuits.

6. A battery monitor including a measuring apparatus, the measuring apparatus including a self test function and comprising:
- a capacitor;
- first to fourth switches;
- a test signal injector;
- at least one comparator having a signal input and a reference input, the first switch being interposed between a first plate of the capacitor and a first input node, the second switch being interposed between a second plate of the capacitor and a second input node, the third switch being interposed between the first plate of the capacitor and the signal input of the comparator, and the fourth switch being interposed between the second plate of the capacitor and a voltage reference, wherein the self test function comprises the steps of:
  - i) operating the signal injector to produce a first signal representative of an out of range voltage for an expected voltage difference between the first and second input nodes, and using the signal to cause the at least one comparator to place its output in an error state, and to charge the capacitor to the out of range voltage,
  - ii) isolating the capacitor from the signal injector and voltage reference, and connecting the capacitor between the first and second input nodes such that the voltage stored on the capacitor is overwritten by the voltage difference between the first and second nodes, and
  - iii) reconnecting the capacitor to the comparator and monitoring the comparator's output.

7. A battery monitor as claimed in claim 6, in which the battery monitor is responsible to a pass or fail signal from another battery monitor, and can combine it with the results from its own self test to output a combined result.

8. A method of testing a voltage measuring circuit, the circuit comprising a voltage comparator, a sampling element and a switching arrangement for selectively connecting the sampling element to the voltage comparator and to a unit under test, the method comprising the steps of:
- a) operating the switching arrangement to enable the sampling element to attain a first voltage which causes the comparator to attain a first state,
- b) operating the switching arrangement to enable the sampling element to sample the voltage across the unit under test, and
- c) operating the switching arrangement to present the sampled voltage of the unit under test to the comparator, and monitoring the comparator output.

9. A method as claimed in claim 8, wherein a test voltage injector is selectively connectable to comparator to provide an over-voltage condition to test the comparator is responsive to an over-voltage fault.

10. A method as claimed in claim 8, wherein a test voltage injector is selectively connectable to the comparator to provide an under-voltage condition to test the comparator's response to an under-voltage fault.

11. A method as claimed in claim 8, in which the output of the comparator is, at each phase of test, compared to an expected state and an error signal is asserted if the comparator is not in an expected state.

12. A method as claimed in claim 8, where the test can be repeated in parallel or in series for a plurality of units under test and the test results combined into a composite indication of pass or fail.

13. A method of monitoring a battery, comprising using the method of claim 8 to monitor the voltage across individual cells or groups of cells of the battery.

* * * * *